United States Patent
Hoomes et al.

(10) Patent No.: US 8,072,266 B1
(45) Date of Patent: Dec. 6, 2011

(54) CLASS G AMPLIFIER WITH IMPROVED SUPPLY RAIL TRANSITION CONTROL

(75) Inventors: Benjamin Hoomes, Milpitas, CA (US); Ansuya Bhatt, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 125 days.

(21) Appl. No.: 12/455,052

(22) Filed: May 27, 2009

Related U.S. Application Data

(60) Provisional application No. 61/215,560, filed on May 7, 2009.

(51) Int. Cl.
*H03F 3/217* (2006.01)

(52) U.S. Cl. ............ 330/251; 330/207 A; 330/297

(58) Field of Classification Search .......... 330/251, 330/207 A, 297
See application file for complete search history.

(56) References Cited

U.S. PATENT DOCUMENTS

| | | | |
|---|---|---|---|
| 7,242,250 B2 * | 7/2007 | Tsurumi | 330/265 |
| 7,482,869 B2 * | 1/2009 | Wilson | 330/199 |
| 7,750,732 B1 * | 7/2010 | Delano et al. | 330/51 |
| 7,782,141 B2 * | 8/2010 | Witmer et al. | 330/297 |
| 7,808,324 B1 * | 10/2010 | Woodford et al. | 330/297 |
| 7,830,209 B1 * | 11/2010 | Woodford et al. | 330/297 |

OTHER PUBLICATIONS

"Class-G Directpath Stereo Headphone Amplifier with I2C Volume Control", Texas Instruments, Mar. 2009, 30 pages.
"Boomer Audio Power Amplifier Series", National Semiconductor, Mar. 24, 2009, 28 pages.

* cited by examiner

*Primary Examiner* — Patricia Nguyen

(57) ABSTRACT

An apparatus and method are provided for a Class G amplifier that includes an output stage, where an output stage supply voltage is selected based upon an input signal voltage of the output stage. The amplifier may also include an input stage coupled to the output stage, where the input stage generates the input signal voltage for the output stage. The output stage may include first and second MOS devices operating as a Class AB amplifier, and the output stage supply voltage selected based upon gate voltages of the MOS devices. The supply voltages may be generated by a buck converter, and a charge pump that is coupled to the buck converter.

20 Claims, 3 Drawing Sheets

CLASS G AMPLIFIER WITH IMPROVED SUPPLY RAIL TRANSITION CONTROL

CROSS-REFERENCE TO RELATED APPLICATION(S) AND CLAIM OF PRIORITY

The present application is related to U.S. Provisional Patent Application No. 61/215,560, filed May 7, 2009, entitled "CLASS G AMPLIFIER WITH IMPROVED SUPPLY RAIL TRANSITION CONTROL". Provisional Patent Application No. 61/215,560 is assigned to the assignee of the present application and is hereby incorporated by reference into the present application as if fully set forth herein. The present application hereby claims priority under 35 U.S.C. §119(e) to U.S. Provisional Patent Application No. 61/215,560.

TECHNICAL FIELD

The present invention is generally directed to amplifiers and, in particular, to a Class G amplifier with improved supply rail transition control.

BACKGROUND

A Class G amplifier is a linear amplifier powered by multiple rail voltages, where load current is drawn through the output stage from the lowest rail that does not clip the output signal. Since this architecture reduces the average voltage drop across the amplifier's output stage, the result is improved efficiency without sacrificing the low-noise/high-linearity performance of a class AB amplifier.

Typically, the selection between supply rails is based on whether an output signal voltage of the amplifier rises above or falls below a threshold reference output voltage ($V_{OREF}$). In order to maximize efficiency without distorting the output signal, the transition from a lower rail to a higher rail is typically made just before the output begins to clip. However, clipping levels are load dependent. An amplifier with a 105Ω load will clip at a lower voltage than the same amplifier loaded with 100Ω.

If $V_{OREF}$ is fixed at a particular value, lightly loaded conditions may result in diminished efficiency due to early tripping. In contrast, heavy loads may pull the clipping voltage below $V_{OREF}$, with the result that the amplifier never transitions to the higher rail.

In other applications, an input signal voltage of the amplifier may be monitored and the supply rail switched when the input voltage rises above or falls below a threshold input voltage ($V_{IREF}$). Such applications often require that $V_{IREF}$ be chosen based upon the load impedance and the gain of the amplifier circuit so that $V_{IREF}$ corresponds to an appropriate output signal voltage.

BRIEF DESCRIPTION OF THE DRAWINGS

For a more complete understanding of the present invention and its advantages, reference is now made to the following description taken in conjunction with the accompanying drawings, in which.

DETAILED DESCRIPTION

FIGS. 1 through 4 and the various embodiments used to describe the principles of the present invention in this patent document are by way of illustration only and should not be construed in any way to limit the scope of the invention. Those skilled in the art will understand that the principles of the present invention may be implemented in any type of suitably arranged amplifier.

Figure 1:
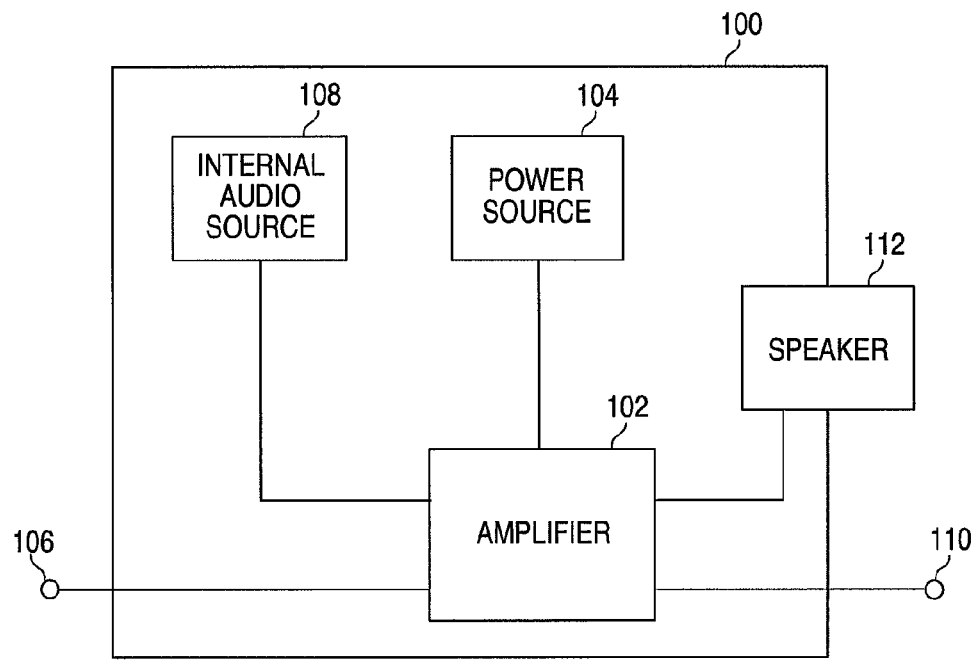
FIG. 1 presents a block diagram of an electronic device incorporating an amplifier according to this disclosure.

FIG. 1 presents a block diagram of an electronic device 100 incorporating an amplifier 102 according to this disclosure. The amplifier 102 receives electrical power from a power source 104. In some embodiments, the power source 104 is a battery. However, it will be understood that the power source 104 may also be a capacitor, an AC/DC converter, or any other suitable source of operating power.

The amplifier 102 may be coupled to an external input connector 106, through which the amplifier 102 receives an audio signal to amplify. The amplifier may also be coupled to an internal audio source 108. Examples of an internal audio source 108 include a cell phone or other wireless communication device, a broadcast radio receiver, a compact disc drive, and a digital music player.

The amplifier 102 may provide an amplified output signal to an external output connector 110. Examples of devices that may be coupled to the external output connector 110 include headphones and external speakers. The amplifier 102 may also be coupled to a speaker 112 mounted in the electronic device 100. In some embodiments, the amplifier 102 may include a switch to deliver its amplified output signal to a selected one of the external connector 110 and the speaker 112.

While the amplifier 102 in FIG. 1 is shown as a single block and its inputs and outputs are shown as single lines, it will be understood that in other embodiments the amplifier 102 may be a stereo amplifier whose inputs and outputs include left and right stereo signals. In still other embodiments, the amplifier 102 may include three or more channels of amplification.

Figure 2:
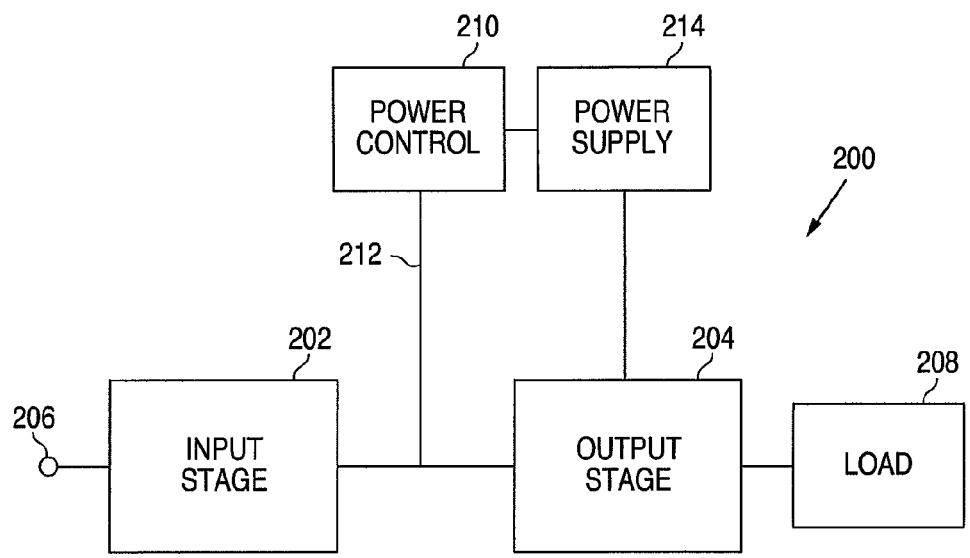
FIG. 2 presents a block diagram of an amplifier according to this disclosure.

FIG. 2 presents a block diagram of an amplifier 200 according to this disclosure. The amplifier 200 could, for example, be used as the amplifier 102 in FIG. 1. In this example, the amplifier 200 includes an input stage 202 that receives an input signal 206. The input stage 202 provides a first amount of amplification or buffering and generates a signal 212, which represents an input signal to an output stage 204. The output stage 204 amplifies the signal 212 to desired levels to produce an amplified output signal, which is provided to a load 208.

The output stage 204 is a Class G amplifier that receives one or more selected power supply rail voltages from a power supply 214. The voltages supplied by the power supply 214 are selected by a power control circuit 210, which is coupled to the power supply 214. The power control circuit 210 receives as an input the signal 212, which is the input signal to the output stage 204 and is generated by the input stage 202.

Thus, in the amplifier 200, the selection of supply rail voltages for the Class G amplifier in the output stage 204 is controlled based upon the signal 212. Where the output stage 204 includes an NMOS/PMOS pair of power devices operating as a Class AB amplifier, gate voltages of the NMOS/PMOS pair may be monitored, and an "about-to-clip" condition may be detected without taking into account load impedance on the Class AB amplifier. When the output signal is within a normal operating range, the power devices remain in saturation, and their gate-to-source voltage ($V_{GS}$) is only slightly more than their threshold voltage ($V_t$). As the output nears clipping, though, the power devices drop into triode operation and $V_{GS}$ increases rapidly.

An amplifier according to this disclosure makes use of this phenomenon by using the $V_{GS}$ value to control the Class G supply rail control circuitry. When a $V_{GS}$ greater than, for example, ~1.5*$V_t$ is detected on the signal 212 by the power control circuit 210, the power control circuit 210 signals the power supply 214 to switch from a lower supply rail voltage to a higher supply rail voltage. In this way, the amplifier 200 switches to the higher rail just before clipping, thereby achieving improved efficiency without encountering the failure-to-trip problems that may occur with heavy loads. The disclosed embodiment thus provides a class G amplifier with higher overall efficiency and provides a longer battery life in portable and handheld devices.

Figure 3:
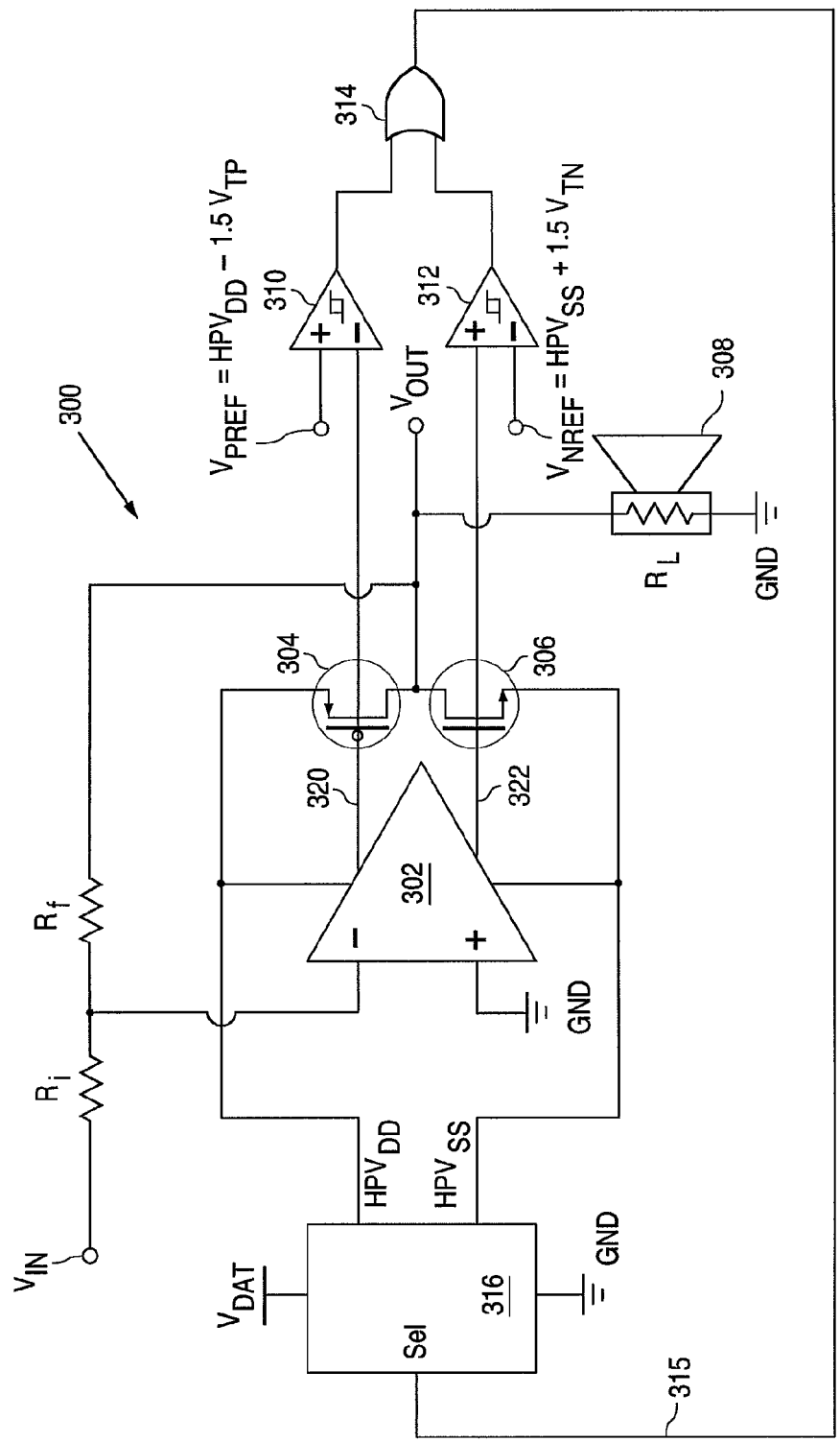
FIG. 3 presents a schematic diagram of an amplifier according to this disclosure.

FIG. 3 presents a schematic diagram of an amplifier 300 according to this disclosure. The amplifier 300 could, for example, represent a specific implementation of the amplifier 102 in FIG. 1 or the amplifier 200 in FIG. 2. An input signal $V_{IN}$ is coupled to an inverting input of an input buffer 302 through an input resistance $R_i$ having a suitable resistance. A non-inverting input of the input buffer 302 is coupled to ground. An output 320 of the input buffer 302 is coupled to a gate terminal of a transistor device 304 and to an input of a comparator 310. An output 322 of the input buffer 302 is coupled to a gate terminal of a transistor device 306 and to an input of a comparator 312. The transistor devices 304 and 306 are PMOS and NMOS devices (respectively) that are configured to form a Class AB amplifier. A common node between the devices 304 and 306 forms an output of the amplifier 300. The output is coupled to a load 308 and provides an output signal $V_{OUT}$. The output is also coupled to the inverting input of the input buffer 302 through a feedback resistance $R_f$.

Outputs of the comparators 310 and 312 are coupled to inputs of an OR gate 314, whose output provides a select (SEL) input 315 to a supply rail select circuit 316. The circuit 316 is also coupled to a power supply voltage $V_{BAT}$ (or $V_{DD}$) and ground. Based upon a logic level of the SEL input 315, the circuit 316 selects a voltage $HPV_{DD}$ provided to the input buffer 302 and the PMOS device 304 and a voltage $HPV_{SS}$ provided to the input buffer 302 and the NMOS device 306. In some embodiments, the circuit 316 provides either 1.1V as $HPV_{DD}$ and –1.1V as $HPV_{SS}$, or 1.8V as $HPV_{DD}$ and 1.8V as $HPV_{SS}$, depending upon a magnitude of the signal being amplified, thereby operating the devices 304 and 306 as a Class G amplifier.

The output 320 of the input buffer 302 is coupled to a non-inverting input of the comparator 310. Coupled to an inverting input of the comparator 310 is a reference voltage $V_{PREF}$, such as:

$$V_{PREF} \approx HPV_{DD} - 1.5 V_{TP},$$

where $V_{TP}$ is the threshold voltage of the device 304. When the output 320 rises above $V_{PREF}$ an output of the comparator 310 becomes high, causing an output of the OR gate 314 to become high.

Similarly, the output 322 of the input buffer 302 is coupled to an inverting input of the comparator 312. Coupled to a non-inverting input of the comparator 312 is a reference voltage $V_{NREF}$, such as:

$$V_{NREF} \approx HPV_{SS} + 1.5 V_{TN},$$

where $V_{TN}$ is the threshold voltage of the device 306. When the output 322 falls below $V_{NREF}$, an output of the comparator 312 becomes high, causing the output of the OR gate 316 to become high.

When the output of the OR gate 316 is high, the circuit 316 provides its higher magnitude positive and negative voltages as $HPV_{DD}$ and $HPV_{SS}$. When the output of the OR gate 316 is low, the circuit 316 provides its lower magnitude positive and negative voltages as $HPV_{DD}$ and $HPV_{SS}$.

Figure 4:
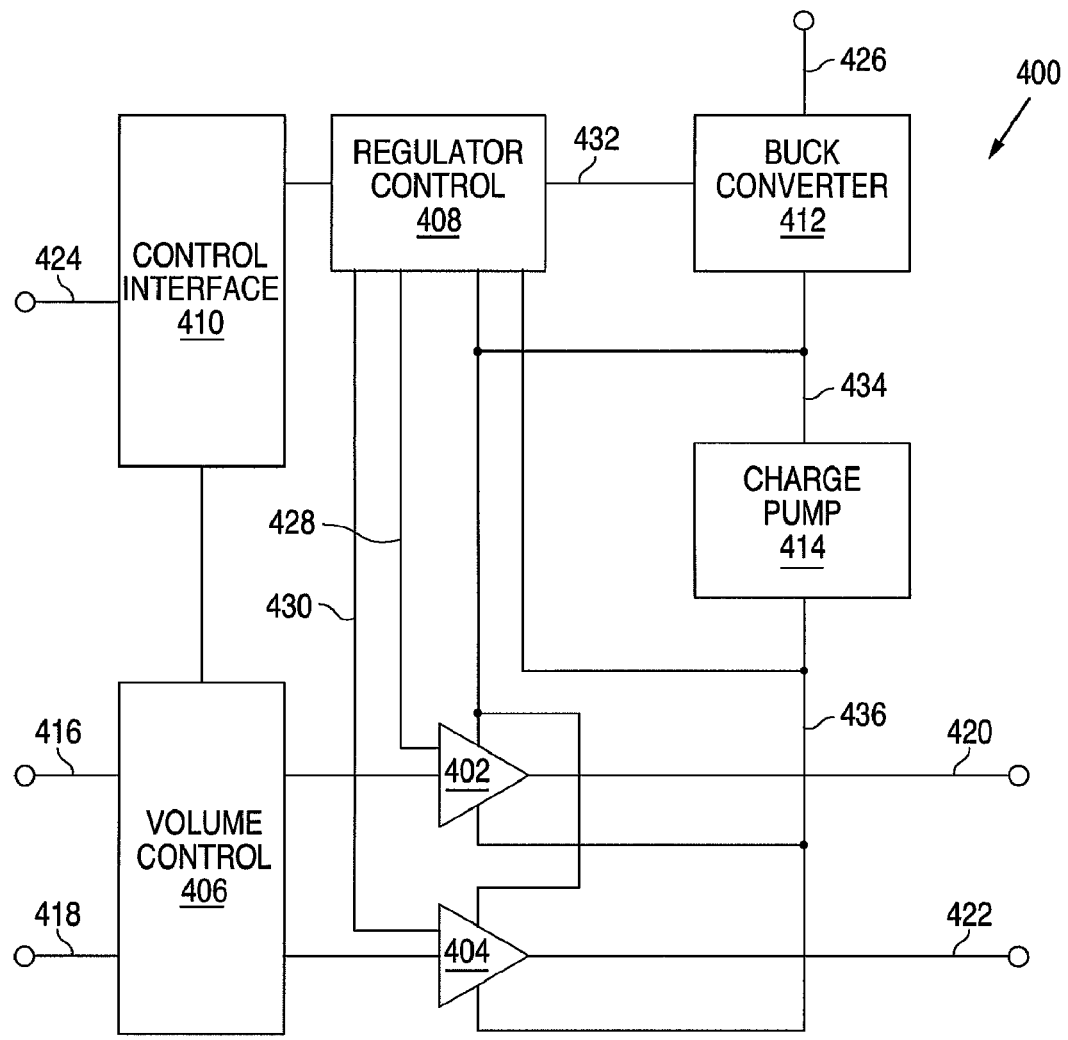
FIG. 4 presents a block diagram of another amplifier according to this disclosure.

FIG. 4 presents a block diagram of another amplifier 400 according to this disclosure. The amplifier 400 is a stereo amplifier, receiving a left channel signal at a left channel input 416 and a right channel signal at a right channel input 418. The left and right channel signals may be attenuated or otherwise modified in a volume control circuit 406. An amplifier 402 receives the left channel signal from the volume control circuit 406 and amplifies it to produce a left channel amplified output 420, and an amplifier 404 receives the right channel signal from the volume control circuit 406 and amplifies it to produce a right channel amplified output 422. Each of the amplifier 402 and the amplifier 404 may represent an amplifier as shown in FIG. 2 or FIG. 3.

The amplifier 402 produces a signal 428 that is based upon an input signal to an output stage of the amplifier 402. The amplifier 404 produces a signal 430 that is based upon an input signal to an output stage of the amplifier 404. The signals 428 and 430 are analogous to the signal 212 in FIG. 2 or the signals 320 and 322 in FIG. 3. The signals 428 and 430 provide inputs to a regulator control circuit 408. The regulator control circuit 408 is analogous to the power control circuit 210 in FIG. 2 or the comparators 310 and 312 and the OR gate 314 in FIG. 3.

The regulator control circuit 408 produces a signal 432 that controls the operation of a buck convertor 412. The signal 432 is analogous to the select signal 315 in FIG. 3. The buck converter 412 receives a power supply voltage 426, which may be $V_{BAT}$ or other suitable power supply voltage. The buck converter 412 produces a positive supply rail voltage 434 ($HPV_{DD}$). The voltage 434 is provided to the amplifiers 402 and 404. The voltage 434 is also provided to the regulator control circuit 408 for use in generating $V_{PREF}$ for comparing with positive signals in the signals 428 and 430.

The voltage 434 is further provided to a charge pump 414, which uses the positive supply rail voltage 434 to produce a negative supply rail voltage 436 ($HPV_{SS}$). The voltage 436 is provided to the amplifiers 402 and 404. The voltage 436 is also provided to the regulator control circuit 408 for use in generating $V_{NREF}$ for comparing with negative signals in the signals 428 and 430.

A control interface 410 receives a control signal 424 and, in response, controls the operation of the volume control circuit 406 and the regulator control circuit 408. Examples of such control include specifying an attenuation or other modification of the input signals 416 and 418 or enabling/disabling the regulator control circuit 408.

While the various embodiments disclosed and described above provide two supply rail voltages, it will be understood that in other embodiments three or more supply rail voltages may be provided. In such embodiments, for example, additional comparators may be provided to compare an input signal voltage of an output stage to two or more reference voltages, with the comparators' outputs combined by a logic circuit other than a simple two-input OR gate. Alternatively, one of two or more reference voltages may be selected based upon a current value of a supply rail voltage. Furthermore, while the amplifiers of the various embodiments disclosed and described above are described as audio amplifiers, it will be understood that the techniques of this disclosure may be used in applications in other frequency ranges where use of a Class G amplifier is beneficial.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or," is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A Class G amplifier comprising:
an output stage comprising a power transistor having a threshold voltage;
wherein the amplifier is configured to select an output stage supply voltage based upon an input signal voltage of the output stage, a current value of the output stage supply voltage, and the threshold voltage.

2. The Class G amplifier of claim 1, further comprising:
an input stage coupled to the output stage, wherein the input stage is configured to generate the input signal voltage for the output stage.

3. A Class G amplifier comprising:
an output stage comprising a first MOS device;
wherein the amplifier is configured to select an output stage supply voltage based upon a gate voltage of the first MOS device; and
wherein the amplifier is configured to alter the output stage supply voltage when the gate voltage of the first MOS device passes a reference voltage that is based on a threshold voltage of the first MOS device.

4. The Class G amplifier of claim 3, wherein:
the output stage further comprises a second MOS device coupled to the first MOS device, the first and second MOS devices configured to operate as a Class AB amplifier; and
the amplifier is configured to select the output stage supply voltage based upon gate voltages of both the first and second MOS devices.

5. The Class G amplifier of claim 4, wherein:
the first MOS device is a PMOS device and the second MOS device is an NMOS device; and
the amplifier is configured to select a positive supply voltage for the PMOS device and a negative supply voltage for the NMOS device.

6. A Class G amplifier comprising:
an output stage comprising a first MOS device and a second MOS device coupled to the first MOS device, the first and second MOS devices configured to operate as a Class AB amplifier, the first MOS device comprising a PMOS device, the second MOS device comprising an NMOS device;
wherein the amplifier is configured to select a positive supply voltage for the PMOS device and a negative supply voltage for the NMOS device based upon gate voltages of both the first and second MOS devices; and
wherein the Class G amplifier further comprises:
a buck converter configured to generate the positive supply voltage; and
a charge pump coupled to the buck converter, the charge pump configured to generate the negative supply voltage.

7. A device comprising:
an audio source;
a power supply; and
a Class G amplifier configured to receive power from the power supply and to receive an audio input signal from the audio source;
wherein the Class G amplifier comprises an output stage, the output stage comprising a power transistor having a threshold voltage; and
wherein the device is configured to select an output stage supply voltage based upon an input signal voltage of the output stage, a current value of the output stage supply voltage, and the threshold voltage.

8. The device of claim 7, wherein the Class G amplifier further comprises an input stage coupled to the output stage, the input stage configured to receive the audio input signal from the audio source and to generate the input signal voltage for the output stage.

9. A device comprising:
an audio source;
a power supply; and
a Class G amplifier configured to receive power from the power supply and to receive an audio input signal from the audio source;
wherein the Class G amplifier comprises an output stage, the output stage comprising a first MOS device;
wherein the device is configured to select an output stage supply voltage based upon a gate voltage of the first MOS device; and
wherein the device is configured to alter the output stage supply voltage when the gate voltage of the first MOS device passes a reference voltage that is based on a threshold voltage of the first MOS device.

10. The device of claim 9, wherein:
the output stage further comprises a second MOS device coupled to the first MOS device, the first and second MOS devices configured to operate as a Class AB amplifier; and
the device is configured to select the output stage supply voltage based upon gate voltages of both the first and second MOS devices.

11. The device of claim 10, wherein:
the first MOS device is a PMOS device and the second MOS device is an NMOS device; and
the device is configured to select a positive supply voltage for the PMOS device and a negative supply voltage for the NMOS device.

12. A device comprising:
an audio source;
a power supply; and
a Class G amplifier configured to receive power from the power supply and to receive an audio input signal from the audio source;
wherein the Class G amplifier comprises an output stage, the output stage comprising a first MOS device and a second MOS device coupled to the first MOS device, the first and second MOS devices configured to operate as a Class AB amplifier, the first MOS device comprising a PMOS device, the second MOS device comprising an NMOS device;
wherein the device is configured to select a positive supply voltage for the PMOS device and a negative supply voltage for the NMOS device based upon gate voltages of both the first and second MOS devices; and
wherein the Class G amplifier further comprises:
a buck converter coupled to the power supply, the buck converter configured to generate the positive supply voltage; and
a charge pump coupled to the buck converter, the charge pump configured to generate the negative supply voltage.

13. A method, comprising:
amplifying a signal using a Class G amplifier comprising an output stage, the output stage comprising a power transistor having a threshold voltage; and
selecting an output stage supply voltage for the Class G amplifier based upon an input signal voltage of the output stage, a current value of the output stage supply voltage, and the threshold voltage.

14. The method of claim 13, wherein:
the Class G amplifier further comprises an input stage; and
the method further comprises generating the input signal voltage for the output stage using the input stage.

15. A method, comprising:
amplifying a signal using a Class G amplifier comprising an output stage, wherein the output stage comprises first and second MOS devices operating as a Class AB amplifier; and
selecting an output stage supply voltage for the Class G amplifier based upon gate voltages of both the first and second MOS devices;
wherein selecting the output stage supply voltage comprises altering the output stage supply voltage when the gate voltage of the first or second MOS device passes a reference voltage that is based on a threshold voltage of the first or second MOS device.

16. The method of claim 15, wherein:
the first MOS device is a PMOS device and the second MOS device is an NMOS device; and
selecting the output stage supply voltage comprises:
generating a positive supply voltage for the PMOS device; and
generating a negative supply voltage for the NMOS device.

17. A method comprising:
amplifying a signal using a Class G amplifier comprising an output stage, wherein the output stage comprises first and second MOS devices operating as a Class AB amplifier; and
selecting an output stage supply voltage for the Class G amplifier based upon gate voltages of both the first and second MOS devices;
wherein the first MOS device comprises a PMOS device and the second MOS device comprises an NMOS device;
wherein selecting the output stage supply voltage comprises generating a positive supply voltage for the PMOS device and generating a negative supply voltage for the NMOS device; and
wherein the positive supply voltage is generated using a buck converter and the negative supply voltage is generated using a charge pump.

18. The Class G amplifier of claim 3, further comprising a comparator configured to compare the gate voltage of the first MOS device and the reference voltage.

19. The device of claim 9, wherein the Class G amplifier further comprises a comparator configured to compare the gate voltage of the first MOS device and the reference voltage.

20. The method of claim 15, further comprising:
comparing the gate voltage of the first MOS device and a first reference voltage using a first comparator; and
comparing the gate voltage of the second MOS device and a second reference voltage using a second comparator.

* * * * *